United States Patent [19]

Ehrfeld et al.

[11] Patent Number: 4,661,212
[45] Date of Patent: Apr. 28, 1987

[54] METHOD FOR PRODUCING A PLURALITY OF PLATE SHAPED MICROSTRUCTURED METAL BODIES

[75] Inventors: Wolfgang Ehrfeld, Karlsruhe; Peter Hagmann, Eggenstein-Leopoldshafen; Asim Maner; Dietrich Münchmeyer, both of Stutensee; Erwin Becker, Karlsruhe, all of Fed. Rep. of Germany

[73] Assignee: Kernforschungszentrum Kalrsruhe GmbH, Karlsruhe, Fed. Rep. of Germany

[21] Appl. No.: 903,304

[22] Filed: Sep. 3, 1986

[30] Foreign Application Priority Data

Oct. 22, 1985 [DE] Fed. Rep. of Germany ....... 3537483

[51] Int. Cl.⁴ ............................................. C25D 1/08
[52] U.S. Cl. ..................................................... 204/11
[58] Field of Search ...................................... 204/4, 11

[56] References Cited

U.S. PATENT DOCUMENTS 4,541,977 9/1985 Becker et al. ..................... 264/102

Primary Examiner—T. M. Tufariello
Attorney, Agent, or Firm—Spencer & Frank

[57] ABSTRACT

In order to produce a plurality of plate shaped metal bodies containing a microstructure from a single molding tool constituting a master for the bodies, a negative mold is formed by filling the recesses in the microstructure of the tool with electrically insulating material and fastening to the insulating material an electrically conductive material which contacts the end faces of the microstructure of the tool.

6 Claims, 14 Drawing Figures

METHOD FOR PRODUCING A PLURALITY OF PLATE SHAPED MICROSTRUCTURED METAL BODIES

BACKGROUND OF THE INVENTION

The present invention relates to a method for producing a plurality of plate shaped microstructured metal bodies.

It is known to produce separating nozzle elements for uranium enrichment with very small characteristic dimensions of an order of magnitude of a few microns and ratios of structural height to smallest characteristic dimensions (aspect ratio) of more than 100 by a process in which a mold plate, or tool, provided with the separating nozzle structures is filled with an electrically insulating molding mass and the resulting mold layer containing the negative molds of the separating structures is filled galvanically, or electrolytically, with a metal, as described in FRG Patent No. 3,206,820 and counterpart U.S. Pat. No. 4,541,977 to Becker et al. This method utilizes the fact that the extremely narrow separating chambers in the separating structures are connected with relatively wide gas conduits through which the molding mass is supplied by way of a cover plate. Due to the conical configuration of the feed channels and the dovetail-like recesses in the cover plate, a solid, form locking connection is created between the mold layer and the cover plate in spite of the poor adhesive forces of the molding mass, thus permitting separation of the mold layer from the mold plate without destruction with the aid of the cover plate. The cover plate is then utilized as the galvanic electrode, whereupon the mold layer is removed.

The combination of plastic molding and galvanoplastic processes described in connection with the manufacture of separating nozzles can be transferred to other plate-shaped microstructured bodies only if the structures include regions which permit a form locking connection of the mold layer with the cover plate intended as a handle during unmolding and as the galvanic electrode. However, in numerous technologically important, plate-shaped microstructured bodies, such as filters, optical filters, image converter plates and the like, this can be accomplished not at all or only at considerable expense.

SUMMARY OF THE INVENTION

It is an object of the present invention to impart the technological and economic advantages of the above-described manufacturing process to plate-shaped microstructured bodies in which a form locking connection of the mold layer with a cover plate suitable as handle during unmolding and as galvanic electrode is not possible or entails considerable expense.

The above and other objects are achieved, according to a first embodiment of the invention, in a method for producing a plurality of plate shaped metal bodies containing a microstructure from a single molding tool containing the microstructure and having a front surface from which the microstructure extends, which method includes producing a negative mold of the tool, the negative mold being of electrically insulating material and having a portion which conforms to the front surface of the tool, electrolytically filling the negative mold with a mass of metal which constitutes such a metal body, and removing the negative mold from the resulting metal body, by the improvement wherein: the method comprises a preliminary step of releasably disposing a layer of electrically conductive material on the front surface of the tool; and the step of producing a negative mold includes transferring the layer of electrically conductive material from the tool to the portion of the negative mold which conforms to the front surface of the tool.

According to a second embodiment of the invention, the objects are achieved, in a method for producing a plurality of plate shaped metal bodies containing a microstructure from a single molding tool containing the microstructure, the microstructure having at least one recess and the tool having a front surface to which the microstructure and the at least one recess exend, which method includes producing a negative mold of the tool, the negative mold being composed at least in part of electrically insulating material, electrolytically filling the negative mold with a mass of metal which constitutes such a metal body, and removing the negative mold from the resulting metal body, the improvement wherein: the step of producing a negative mold comprises forming the negative mold to have a first portion of electrically insulating material which fills all recesses in the tool and extends not beyond the front surface of the tool and a second portion which is electrically conductive, covers, and conforms to, the front surface of the tool, and is joined to the first portion.

The invention is based on the surprising realization that the replacement of the cover plate by the measures described above permits not only problem-free separation of the mold layer from the tool but also problem-free galvanic filling of the negative molds themselves with a very high aspect ratio in the microstructure.

The process is particularly suitable for the mass production of plate-shaped microstructured bodies having a high aspect ratio, e.g. for highly transparent mechanical or optical filters, image converter plates or the like. The first procedure described above is preferred if the frontal faces of the microstructures of the tool form an interconnected surface so that the electrically conductive material, which in the course of the molding process is transferred to the regions of the molding mass, or mold bottom, opposite the frontal faces, forms an electrically interconnected electrode for the process of galvanically filling the negative molds of the microstructures with a metal.

The second procedure described above is used with preference if the frontal faces of the microstructures of the tool form no interconnected surface. In this case, the electrically conductive molding mass forms the electrically interconnected electrode for galvanically filling the negative molds of the microstructures with a metal.

BRIEF DESCRIPTION OF THE DRAWING

FIGS. 12-14 are cross-sectional views illustrating the fabrication of a structure according to further embodiments of the invention.

DESCRIPTION OF THE PREFERRED EMBODIMENTS

Figure 1:
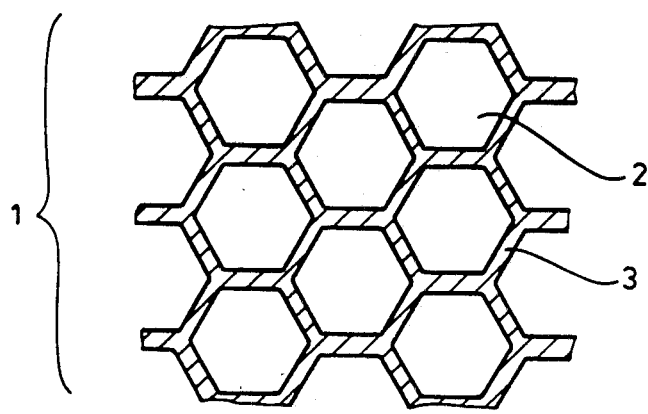
FIG. 1 is a cross-sectional view of a first example of a body produced according to the invention.

FIG. 1 shows the example of a plate-shaped microstructured body 1 in the form of a continuous structure which can be mass produced to advantage by the first procedure according to the invention and which is a metal body having a honeycomb structure. The diameter of cavities 2 of the honeycombs, in one specific embodiment, is $20\mu$, the wall thickness of the intermediate webs 3 is $2\mu$ and the height of the body, perpendicular to the plane of FIG. 1 is $350\mu$.

FIGS. 2 to 5 are cross-sectional views showing successive steps in the method of producing the structure of FIG. 1 according to the invention.

Figure 2:
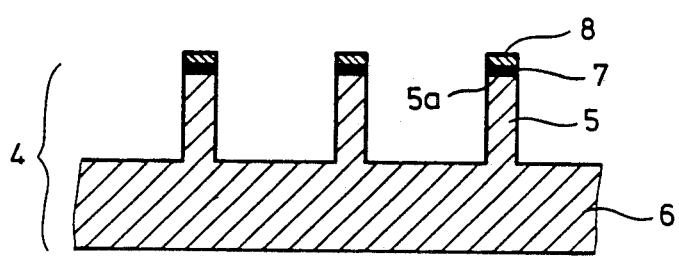
FIGS. 2-5 are cross-sectional views illustrating successive steps in the fabrication of the structure of FIG. 1.

FIG. 2 shows a tool, or master, 4 composed of microstructures 5 corresponding to microstructured body 1 and a base plate 6 fixed to the microstructures. A layer of a mold release agent 7 is applied to the frontal faces 5a of microstructures 5 of tool 4. For this purpose, a stable, planar metal plate which is permanently coated with a thin, elastic coating, is covered by a spin coating process known in the microelectronics art with a commercially available mold release agent on a silicone base. From this intermediate substrate (not shown) the mold release agent is transferred by mechanical contact to the frontal faces 5a of tool 4.

Then an electrically conductive material 8, composed of low molecular polymethyl methacrylate (PMMA), mixed with 20 to 50 weight % soot having a particle size less than $0.1\mu$ (CORAX L made by Degussa) and chlorobenzene as solvent to set the viscosity is transferred in the same manner.

Exemplary thickness values for release agent 7 and conductive material 8 range from 0.1 to $1\mu$.

Figure 3:
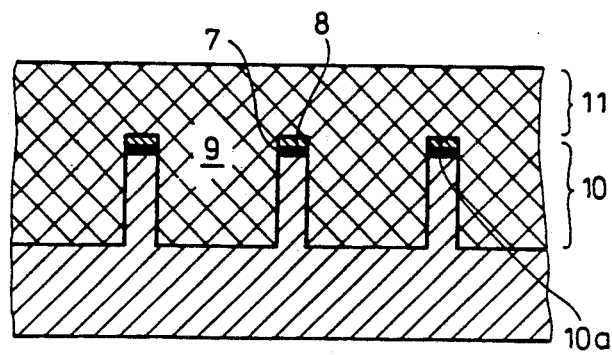

When the electrically conductive material 8 has dried, the gaps between microstructures 5 are filled, and the microstructures are covered, with an electrically insulating molding mass 9, as shown in FIG. 3. A casting resin, e.g. PLEXIT 60 made by Röhm to which 1% of a phlegmatized 50% benzene peroxide has been added as hardener, is used as the molding mass 9. Mass 9 consists of a negative mold part 10 and a covering part 11. To facilitate removal from the mold, an internal mold release agent, e.g. type PAT 665 made by Würtz GmbH, is also added to the casting resin in a quantity of 4 volume %.

Figure 4:
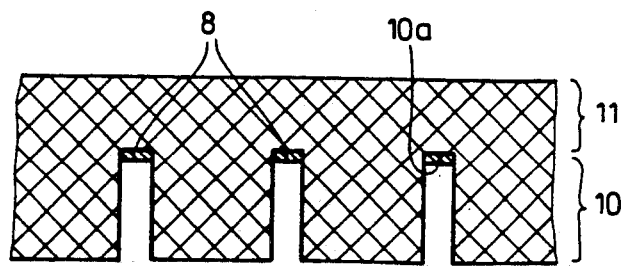

After warm hardening of the molding mass 9, during which the electrically conductive material 8 enters into a firm bond with the hardening molding mass 9, mass 9 is unmolded. This operation is aided by using layer 11, which projects beyond the microstructures, as a handle. The electrically conductive material 8 then adheres to the mold bottom 10a of negative mold 10, while it is released completely from tool 4 due to the presence of mold release agent layer 7. The completion of this step is shown in FIG. 4.

Figure 5:
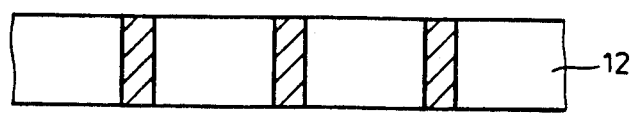

Then, negative mold 10 is filled electrolytically, using electrically conductive material 8 as the electrode, and the negative mold 10, 11 is removed to leave a plate-shaped microstructured metal body 12, as shown in FIG. 5, which is the finished body of FIG. 1.

Figure 6:
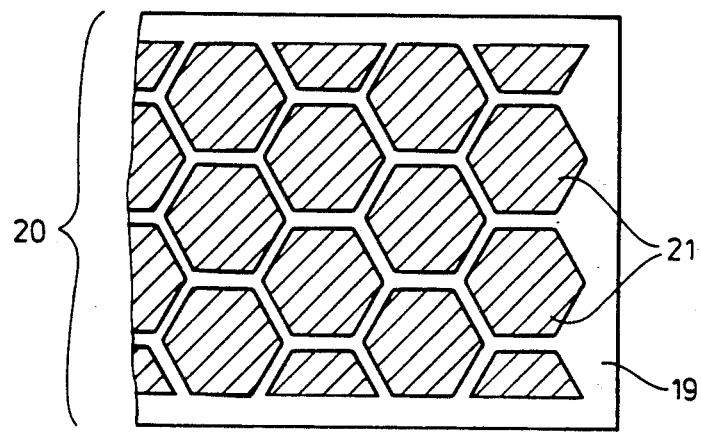
FIG. 6 is a view similar to that of FIG. 1 of a second example of a body produced according to the invention.

FIG. 6 shows an example of a plate-shaped microstructured body composed of individual structures, which is mass produced to advantage by the second procedure according to the invention. In this case, the body is a microstructure 20 of hexagonal, metal prisms 21 which, in its outline, is complementary to honeycomb structure 1 of FIG. 1. Prisms 21 are mounted on a base plate 19.

FIGS. 7 to 11 are cross-sectional views showing the implementation of the procedure according to the invention for forming this structure.

Figure 7:
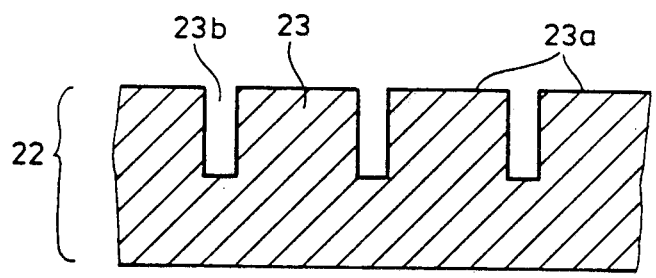
FIGS. 7-12 are cross-sectional views illustrating successive steps in the fabrication of the structure of FIG. 6.
Figure 8:
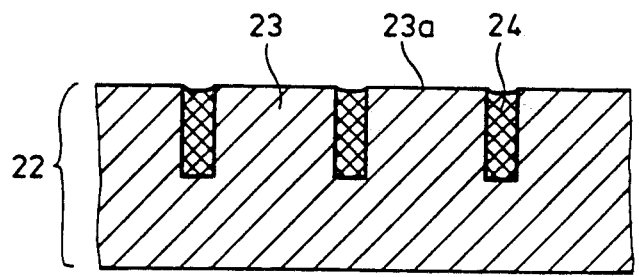

FIG. 7 shows a tool, or master, 22 corresponding to microstructured body 20. Tool 22 is composed of microstructures 23 having frontal faces 23a and separated by gaps, or interstices, 23b. A cold hardening casting resin, e.g. PLEXIT 74 containing 4 weight % catalyst type 20, both obtainable from Röhm, is used as an electrically insulating molding mass 24 which is poured onto tool 22 to fill interstices 23b. Immediately thereafter, any material of mass 24 projecting beyond the frontal faces 23a of the microstructures 23 of tool 22 is scraped away with a squeegee-like device so that only the interstices 23b of microstructures 23 are filled with the molding mass 24, as shown in FIG. 8.

Figure 9:
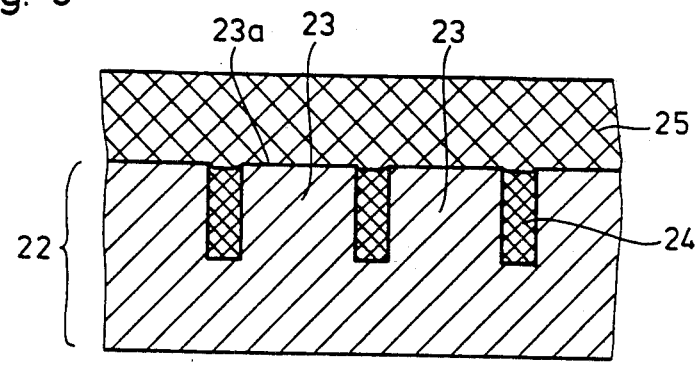
Figure 10:
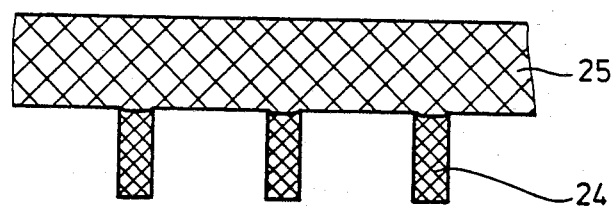
Figure 11:
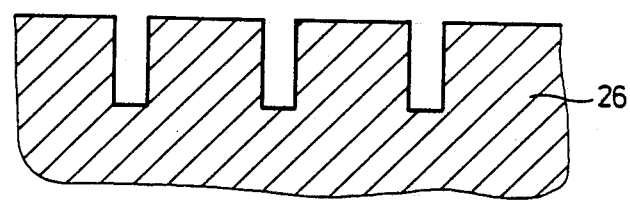

After this molding mass 24 has partially hardened, frontal faces 23a and mass 24 are covered with a layer 25 of an electrically conductive molding mass 25, as shown in FIG. 9. Mass 25 may be a mixture of 25 parts by weight of the above-mentioned soot CORAX L, 50 parts by weight PLEXIT 74, 5 parts by weight catalyst type 20 and 20 parts by weight methyl methacrylate. When both molding masses 24 and 25 have hardened completely so that they are bonded together, unmolding from tool 22 takes place, with the layer of electrically conductive molding mass 25 serving as the handle, to provide the mold shown in FIG. 10. By galvanically, or electrolytically, filling the thus produced negative mold 24, 25, with electrically conductive layer 25 serving as the electrode, and subsequent removal of negative mold 24, 25, the plate-shaped microstructured metal body 26 is obtained, as shown in FIG. 11.

Figure 12:
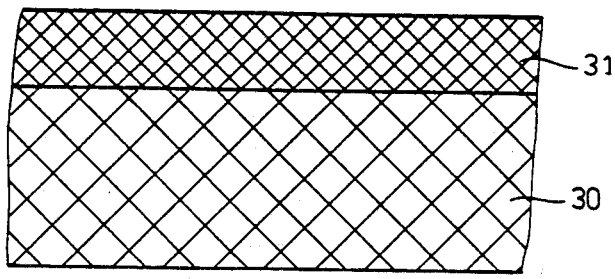
Figure 13:
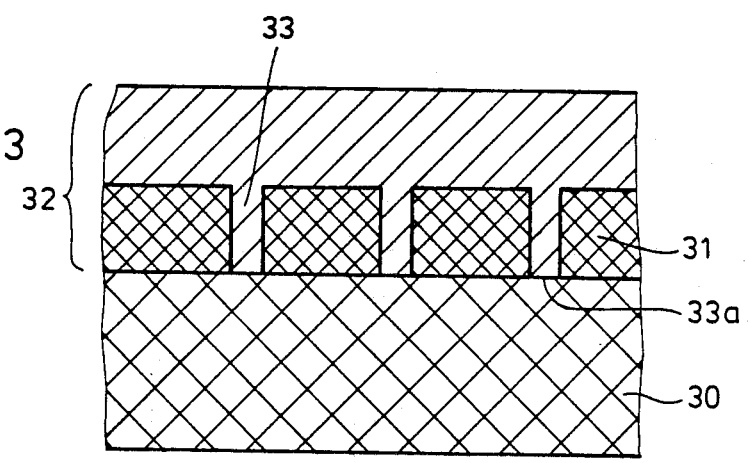

A variation of the second procedure according to the invention is depicted in FIGS. 12 and 13. Referring to FIG. 12, initially 20 weight % conductive soot is worked into a PLEXIGLAS molding mass of type 8N made by Röhm with the aid of a continuous worm kneader and, by ejection molding, a layer 30 having a thickness of 5 mm is produced to serve as the electrically conductive molding mass. A PLEXIGLAS molding mass type 6Nle is then sprayed over layer 30 to form an electrically insulating molding mass 31 with a thickness of 0.3 mm. Mass 31 has a softening temperature that is 18° lower than that of mass 30. At a temperature of 110° C., tool 32 is pressed into this compound, as shown in FIG. 13, so that the frontal faces 33a of microstructures 33 of tool 32 just contact the electrically conductive molding mass 30. After the tool has cooled, unmolding takes place. The thus produced negative mold is processed further, as described above, with layer 30 serving as the electrode for the electrolyte system.

In order to assure that all recesses in the tool are filled and that the tool will reliably contact conductive layer 30, the thickness of the layer formal by the electrically insulating mold mass 31 must be carefully adjusted. The optimum thickness and the optimum value of the force which is applied to press the tool 32 into the compound are usually determined in a series of experiments.

Figure 14:
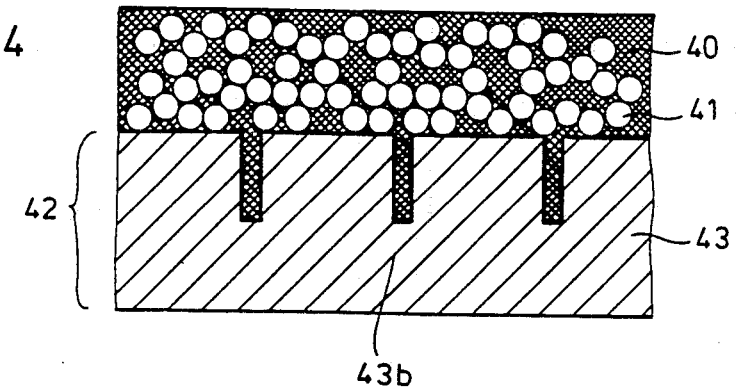

FIG. 14 shows a further variation of the second procedure. Here, a casting mass 40, e.g. PLEXIT 60 with hardener additive, which had previously been mixed with 20 weight % silver powder 41 in a grain size of 10 $\mu$ is poured onto tool 42. Because of their size, the electrically conductive silver particles 41 are unable to penetrate into the fine spaces 43b of microstructures 43 during the casting process. After polymerization of mass 40, unmolding takes place and the above-described further process steps are performed, with the portion of mass 40 containing silver particle 41 serving as an electrode.

The basic idea of the invention also applies if instead of the electrically conductive material or the electrically conductive molding mass, nonconductive substances are used which are converted into an electrically conductive material after the molding process or in the course of the molding procedure by way of a chemical process, for example by the reduction of metal compounds.

Similarly, the invention encompasses procedures in which conductive layers produced according to the invention at the bottom of the mold are reinforced by metallization without external current, e.g. by chemical nickel plating, before the negative molds are filled electrolytically. If required, the metallization without external current may here be supported by a preceding nucleation process, e.g. with palladium.

In carrying out all of the processes according to the invention, the parameters, such as time, temperature, etc., for each individual step can be established on the basis of knowledge already possessed by those skilled in the art.

The present disclosure relates to the subject matter disclosed in Federal Republic of Germany No. P 35 37 483.7 of Oct. 22nd, 1985, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. In a method for producing a plurality of plate shaped metal bodies containing a microstructure from a single molding tool containing the microstructure and having a front surface from which the microstructure extends, which method includes producing a negative mold of the tool, the negative mold being of electrically insulating material and having a portion which conforms to the front surface of the tool, electrolytically filling the negative mold with a mass of metal which constitutes such a metal body, and removing the negative mold from the resulting metal body, the improvement wherein:

said method comprises a preliminary step of releasably disposing a layer of electrically conductive material on the front surface of the tool; and said step of producing a negative mold includes transferring the layer of electrically conductive material from the tool to the portion of the negative mold which conforms to the front surface of the tool.

2. A method as defined in claim 1 wherein said step of releasably disposing a layer comprises: initially disposing a thin, uniform layer of the electrically conductive material on an intermediate substrate, and bringing the front surface of the tool into contact with the uniform layer for transferring electrically conductive material from the uniform layer to the front surface.

3. In a method for producing a plurality of plate shaped metal bodies containing a microstructure from a single molding tool containing the microstructure, the microstructure having at least one recess and the tool having a front surface to which the microstructure and the at least one recess exend, which method includes producing a negative mold of the tool, the negative mold being composed at least in part of electrically insulating material, electrolytically filling the negative mold with a mass of metal which constitutes such a metal body, and removing the negative mold from the resulting metal body, the improvement wherein:

said step of producing a negative mold comprises forming the negative mold to have a first portion of electrically insulating material which fills all recesses in the tool and extends not beyond the front surface of the tool and a second portion which is electrically conductive, covers, and conforms to, the front surface of the tool, and is joined to the first portion.

4. A method as defined in claim 3 wherein said step of producing a negative mold comprises: forming the first portion by filling all recesses of the microstructure contained by the tool with electrically insulating material, and forming the second portion by disposing a layer of an electrically conductive molding mass upon the front surface of the tool so that the molding mass contacts the front surface and is joined to the electrically insulating material.

5. A method as defined in claim 3 wherein said step of producing a negative mold comprises: providing a first layer of a deformably electrically conductive molding material; attaching to the first layer a second layer of deformable electrically insulating molding material; and pressing the molding tool into the second layer, with the front surface of the tool directed toward the second layer, until the front surface of the molding tool contacts the first layer.

6. A method as defined in claim 3 wherein the microstructure contained by the tool includes recesses which extend to the front surface of the tool, and said step of producing a negative mold comprises: providing a molding mass of deformable, electrically insulating material containing solid, electrically conductive particles having dimensions which are selected to render the particles incapable of entering the recesses; and pressing the tool into the molding mass sufficiently to fill the recesses and cover the front face of the tool with the electrically insulating material so as to form the negative mold, whereby the first portion of the negative mold consists of electrically insulating material and the second portion of the mold is composed of electrically insulating material filled with the conductive particles.

* * * * *